United States Patent

Kang

[11] Patent Number: 6,127,218
[45] Date of Patent: *Oct. 3, 2000

[54] METHODS FOR FORMING FERROELECTRIC FILMS USING DUAL DEPOSITION STEPS

[75] Inventor: Chang-seok Kang, Kyungki-do, Rep. of Korea

[73] Assignee: Samsung Electronics Co., Ltd., Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/843,506

[22] Filed: Apr. 16, 1997

[30] Foreign Application Priority Data

May 25, 1996 [KR] Rep. of Korea ............... 96-17880

[51] Int. Cl.⁷ .................................. H01L 21/8242
[52] U.S. Cl. .................................. 438/240; 438/3
[58] Field of Search ................... 438/3, 240, 253, 438/396, 287, 686

[56] References Cited

U.S. PATENT DOCUMENTS

| | | | |
|---|---|---|---|
| 3,793,605 | 2/1974 | Fehlner | 428/209 |
| 5,374,578 | 12/1994 | Patel et al. | 438/3 |
| 5,397,446 | 3/1995 | Ishihara et al. | 204/192.18 |
| 5,431,958 | 7/1995 | Desu et al. | 427/255.3 |
| 5,442,585 | 8/1995 | Eguchi et al. | 257/306 |
| 5,478,610 | 12/1995 | Desu et al. | 427/573 |
| 5,506,748 | 4/1996 | Hoshiba | 361/321.4 |
| 5,612,229 | 3/1997 | Yoshida | 257/436 |
| 5,665,210 | 9/1997 | Yamazaki | 438/3 |
| 5,670,218 | 9/1997 | Baek | 118/50 |
| 5,674,563 | 10/1997 | Tarui et al. | 427/250 |
| 5,714,194 | 2/1998 | Komai et al. | 427/81 |
| 5,728,603 | 3/1998 | Emesh et al. | 438/3 |
| 5,736,449 | 4/1998 | Miki et al. | 438/396 |
| 5,824,590 | 10/1998 | New | 438/3 |

*Primary Examiner*—Chandra Chaudhari
*Assistant Examiner*—Jack Chen
*Attorney, Agent, or Firm*—Myers Bigel Sigley & Sajovec

[57] ABSTRACT

A method for forming a ferroelectric film on an integrated circuit substrate includes dual deposition steps. In particular, a first portion of the ferroelectric film is formed on the integrated circuit substrate using a source gas and a first oxidant for a first predetermined period of time. A second portion of the ferroelectric film is then formed on the first portion opposite the substrate using the source gas and a second oxidant for a second predetermined period of time wherein the second oxidant is different from the first oxidant. In particular, the second oxidant can include a mixture of the first oxidant and another oxidant gas.

17 Claims, 6 Drawing Sheets

METHODS FOR FORMING FERROELECTRIC FILMS USING DUAL DEPOSITION STEPS

FIELD OF THE INVENTION

The present invention relates to the field of microelectronics and more particularly to methods for forming ferroelectric films for microelectronic devices.

BACKGROUND OF THE INVENTION

A dynamic random access memory (DRAM) includes arrays of memory cells wherein each memory cell includes a memory cell capacitor and a memory cell access transistor. Each memory cell stores 1 bit of data, and the memory cell capacitor may have a capacitance of at least 30 fF to reduce soft errors due to $\alpha$ particle irradiation. As the size of memory cells have been reduced to increase integration densities, there have been efforts to provide predetermined capacitances with smaller capacitors.

The capacitance of a given capacitor can be determined using the equation listed below.

$$C = \frac{\epsilon_o \epsilon_r A}{d}$$

In this equation C is the capacitance of the capacitor, $\epsilon_o$ is the permeability of a vacuum, $\epsilon_r$ is the dielectric constant of the capacitor dielectric, A is the effective area of the capacitor electrode, and d is the thickness of the capacitor dielectric film. Accordingly, the capacitance can be increased by decreasing the thickness of the dielectric film, increasing the effective area of the capacitor electrodes, and increasing the dielectric constant of the capacitor dielectric.

When decreasing the thickness of a capacitor dielectric film to 100 Å or less, the reliability of the capacitor may be reduced. In particular, Fowler-Nordheim currents may result when thin dielectric films are used in a large capacity memory device. The effective area of the capacitor electrode may be increased by using a three dimensional capacitor structure. The fabrication of a three dimensional capacitor structure may, however, be more complicated thus increasing production costs. In particular, three dimensional structures such as stack-type structures and trench-type structures have been applied to 4 MB DRAMs, but these structures may be difficult to apply to 16 MB or 64 MB DRAMs. Moreover, a stack-type capacitor may have a relatively steep step due to the height of the stack-type capacitor over the memory cell transistor. In addition, leakage currents may occur between trenches of trench-type capacitors when scaled down to the size required for a 64 MB DRAM.

Materials with relatively high dielectric constants include Yttria ($Y_2O_3$), tantalum oxide ($Ta_2O_5$), titanium oxide ($TiO_2$). In addition, ferroelectric materials such as PZT ($PbZr_xTi_{1-x}O_3$) or BST ($Ba_xSr_{1-x}TiO_3$) have been used to provide relatively high dielectric constants. A ferroelectric material exhibits a spontaneous polarization phenomenon, and dielectric constants for ferroelectric materials can range from on the order of hundreds up to thousands. When using a ferroelectric material as a dielectric film for a capacitor, a thickness of hundreds of angstroms can provide a dielectric equivalent of a 10 Å oxide film.

Methods for manufacturing dielectric films for DRAMs or nonvolatile memories have been proposed using a Perovskite-structured oxide, such as PZT ($PbZrTiO_3$), BST ($BaSrTiO_3$), or STO ($SrTiO_3$). For example, a method for forming a BST film using chemical vapor deposition (CVD) is discussed in the reference by Takaaki Kawahara et al., entitled "Surface Morphologies and Electrical Properties of (Ba, Sr)$TiO_3$ Films Prepared by Two-Step Deposition of Liquid Source Chemical Vapor Deposition", Japanese Journal of Applied Physics, Vol. 34, pp. 5077–5082, September 1995.

According to the Kawahara reference, the surface of a thin ferroelectric film may become nonuniform if the ferroelectric film is formed as a single film. The nonuniformity may result because of protrusions caused by a nonuniform density in nuclear generation. In addition, the Kawahara reference states that the nonuniformity can be reduced by depositing a buffer layer of 60 Å while maintaining the substrate at a temperature in the range of 420° C., performing a first anneal in a nitrogen $N_2$ ambient, depositing a main layer, and performing a second anneal in an nitrogen $N_2$ ambient to crystallize the thin film. The Kawahara process, however, may be complicated because two annealing steps are used to obtain a crystal form of BST.

In addition, Japanese publication No. Hei 6-21337 discusses a dielectric device capable of reducing leakage current of a ferroelectric film due to a fatigue phenomenon. According to the reference, when an $ABO_3$ structured ferroelectric material such as PZT is used as a dielectric film of a capacitor, the ratio of element composition of a cubic "A" with respect to the element composition of cubic "B" ([A]/([A]+[B])) in the boundary surface between the ferroelectric material and an electrode is different from that in a bulk region of the ferroelectric material. To form such a dielectric device, a source component of the ferroelectric film or the condition of a reactive chamber within which deposition of the ferroelectric film is performed is changed, and the manufacturing process may become complicated. Notwithstanding the structures discussed above, there continues to exist a need in the art for improved methods of forming dielectric films having relatively high dielectric constants.

SUMMARY OF THE INVENTION

It is therefore an object of the present invention to provide improved methods for forming ferroelectric films, capacitors, and memory devices.

It is another object of the present invention to provide ferroelectric films having reduced protrusions.

It is still another object of the present invention to provide ferroelectric films having increased dielectric constants.

It is yet another object of the present invention to provide capacitors having reduced leakage currents.

These and other objects according to the present invention are provided by methods for forming ferroelectric films on integrated circuit substrates using dual deposition methods. In particular, a first portion of the ferroelectric film is formed on the integrated circuit substrate using a source gas and a first oxidant for a first predetermined period of time. A second portion of the ferroelectric film is then formed on the first portion opposite the substrate using the source gas and a second oxidant for a second predetermined period of time wherein the second oxidant is different from the first oxidant. This dual deposition method can increase the dielectric constant of the ferroelectric film, reduce protrusions of the ferroelectric film, and reduce leakage currents through the ferroelectric film.

In particular, the second oxidant can include a mixture of the first oxidant and another oxidant gas. For example, the first oxidant can include a first gas such as $O_2$ or $O_3$, and the second oxidant can include the first gas and a second gas such as $N_2O$ or $NO_x$. Alternately, the first oxidant can include a first gas such as $N_2O$ or $NO_x$, and the second oxidant can include the first gas and a second gas such as $O_2$ or $O_3$.

The first predetermined period of time and the second predetermined period of time together define a total deposition time and the first predetermined period of time can be in the range of 1% to 50% of the total deposition time. The ferroelectric film can be $SrTiO_3$, $(Ba, Sr)TiO_3$, $PbZrTiO_3$, $SrBi_2Ta_2O_9$, $(Pb, La) (Zr, Ti)O_3$, or $Bi_4Ti_3O_{12}$. The source gas can be $Sr(DPM)_2$ tetraglyme or $Ti(DPM)_2(O-i-Pr)_2$.

According to an alternate aspect of the present invention, a method is provided for forming a capacitor on an integrated circuit substrate. This method comprises the steps of forming a first conductive film on the integrated circuit substrate, and forming a ferroelectric film on the first conductive film. In particular, the step of forming the ferroelectric film includes dual deposition steps.

A first portion of the ferroelectric film is formed on the first conductive layer using a source gas and a first oxidant for a first predetermined period of time. A second portion of the ferroelectric film is formed on the first portion of the ferroelectric film using the source gas and a second oxidant for a second predetermined period of time wherein the second oxidant is different from the first oxidant. A second conductive film is then formed on the second portion of the ferroelectric film opposite the first conductive film. The ferroelectric film thus has an increased dielectric constant allowing an increase in the capacitance of the capacitor. In addition, the ferroelectric film may have a reduction in the protrusions thereon, and the leakage current for the capacitor can be reduced.

According to still another aspect of the present invention, a method is provided for forming an integrated circuit memory device including a ferroelectric film as the dielectric for the memory cell capacitor. In particular, the memory cell capacitor is formed using a ferroelectric film as discussed above. The increased dielectric constant can be used to maintain a desired capacitance for the memory cell capacitor despite reductions in size thereof. Accordingly, a soft error rate can be reduced. In addition, a reduction in leakage current can reduce the frequency of refresh cycles.

DETAILED DESCRIPTION

Figure 1A:
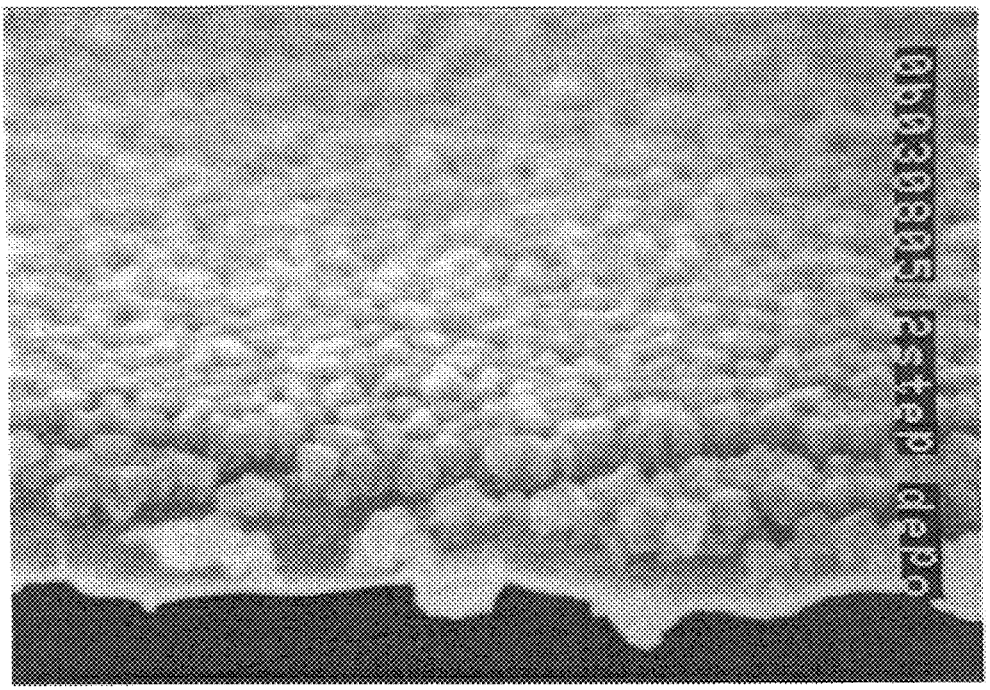
FIGS. 1A to 1C are scanning electron microscope (SEM) pictures illustrating ferroelectric films formed according to methods of the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

An STO ferroelectric film can be formed by a method according to the present invention under the conditions shown below in Table 1.

| source | $Sr(DPM)_2$ tetraglyme, $Ti(DPM)_2(O-i-Pr)_2$ |
|---|---|
| solvent | tetrahydrofuran (THF) |
| liquid flow rate | 0.10 ml/min |
| substrate temperature | 550° C. |
| chamber pressure | 1 Torr |
| oxidant | $O_2$, $N_2O$ or $O_2 + N_2O$ |
| substrate structure | $Pt(1000Å)/SiO_2/Si$ |
| carrier gas/flow rate | Ar/200 sccm |
| vaporizer temperature | 240° C. |
| deposition time | 15 minutes |

Figure 1B:
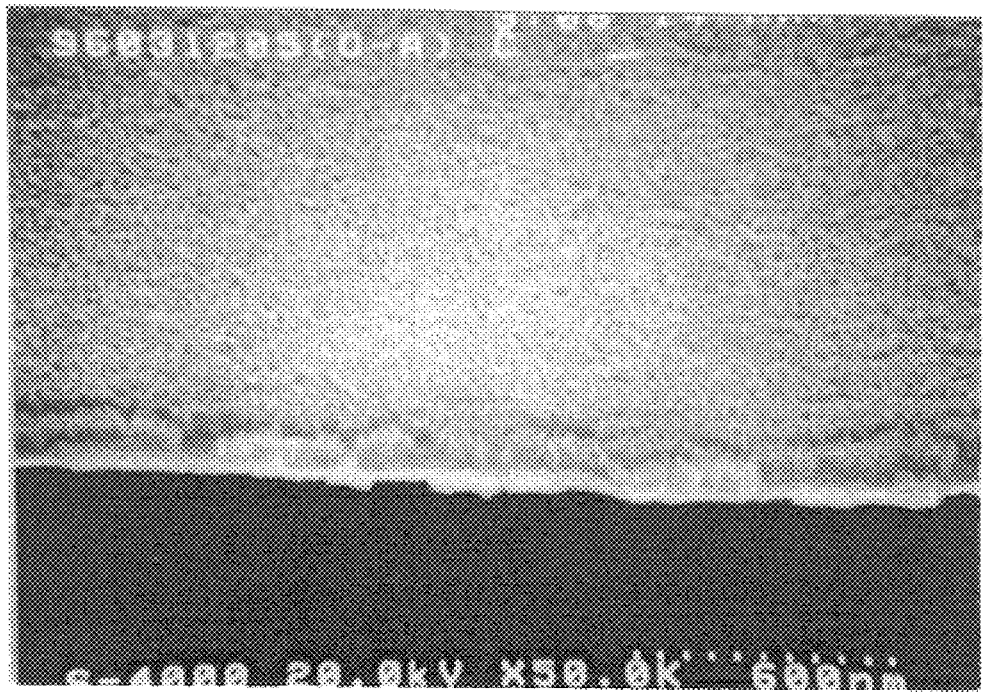
Figure 1C:
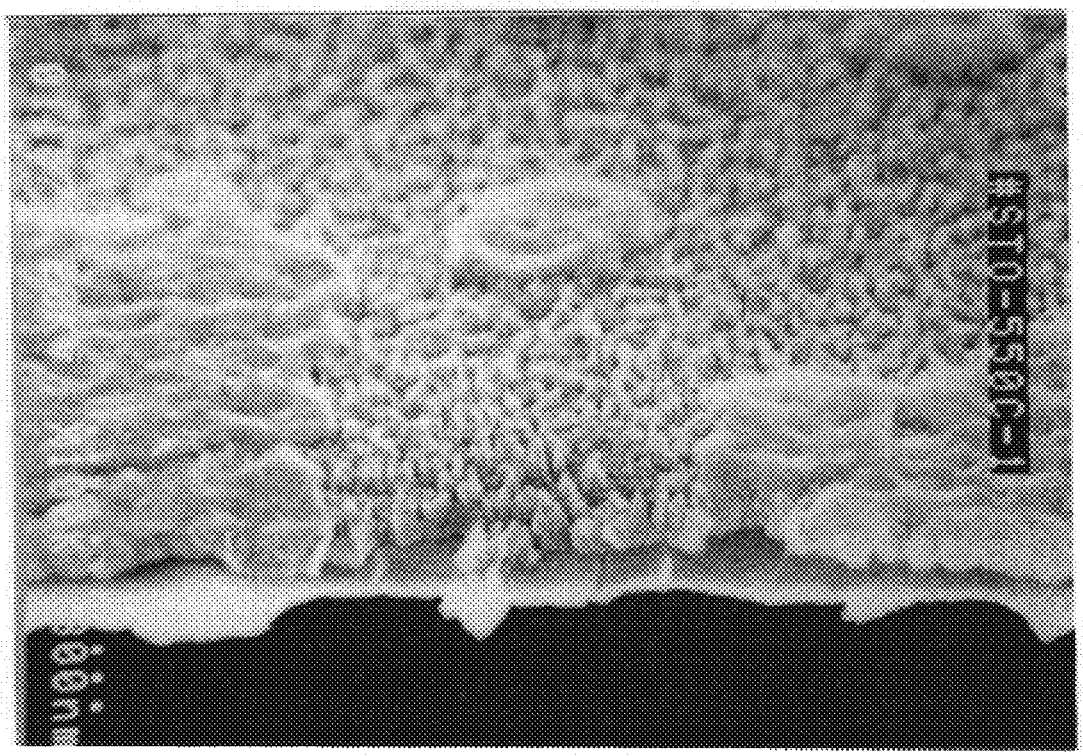

FIGS. 1A to 1C are scanning electron microscope (SEM) pictures illustrating surfaces of thin ferroelectric films formed using the oxidant gases listed in Table 1.

In FIG. 1A, the ferroelectric film is formed using two deposition steps. The first deposition step is used to formed an initial layer, and a second deposition step forms a main portion of the ferroelectric film. During the first step, the oxidizing gas $N_2O$ is injected for approximately 60 seconds, and during the second step, an oxidizing gas comprising $N_2O$ and $O_2$ mixed in a proportion of 1:1 is injected for 14 minutes. Accordingly, the injection of $N_2O$ during the first step occurs for approximately 6.7 percent of the total deposition time, and the second step including the injection of the oxidant gas including $N_2O$ and $O_2$ occurs for approximately 93.3 percent of the total deposition time.

In FIG. 1B, the ferroelectric film is formed using a two step deposition method similar to that used to form the film shown in FIG. 1A. When forming the ferroelectric film of FIG. 1B, however, the first deposition step is formed while injecting $O_2$ as the oxidant gas for approximately 60 seconds. During the second deposition step, an oxidant gas comprising $N_2O$ and $O_2$ mixed in a proportion of 1:1 is injected for 14 minutes.

FIG. 1C shows a ferroelectric film formed using a single step deposition method. In particular, an oxidant gas comprising $N_2O$ and $O_2$ mixed in proportion of 1:1 is injected during the single 15 minute deposition step. As shown in FIGS. 1A–1C, the two step deposition methods can be used to form ferroelectric films having increased uniformity and reduced protrusions.

It has been reported that the dielectric constant of an STO film is largest when the ratio Sr/Ti is 1. See P. Y. Lesaicherre, "Preparation of ECR MOCVD $SrTiO_3$ Thin Films and Their Application to a Gbit-Scale DRAM Stacked Capacitor Structure", Korea Vacuum Society, Seoul, Feb. 17, 1995. It has also been reported that the dielectric constant and the leakage current of an STO film are reduced when the quantity of Ti is greater than that of the Sr.

Ferroelectric films can be formed using the conditions listed in Table 1. In particular, the components of the oxidant gas were changed, and the compositions of the ferroelectric films formed thereby were examined.

Figure 2A:
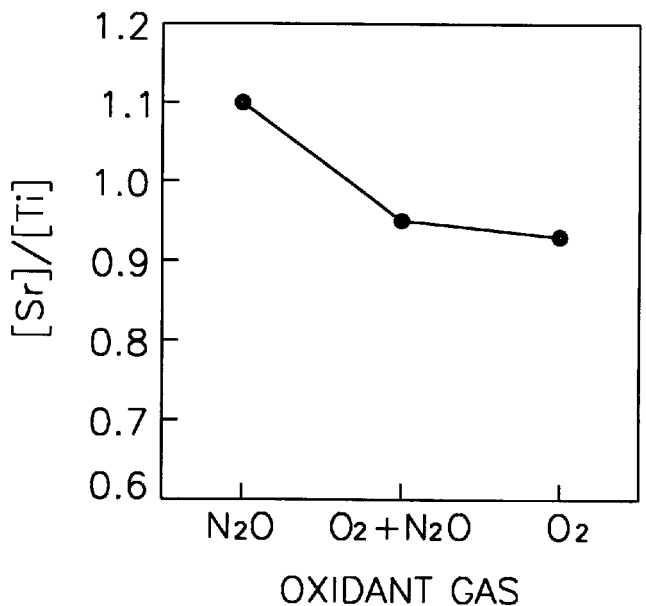
FIGS. 2A to 2B are graphs illustrating composition ratios of ferroelectric films formed according to the present invention.
Figure 2B:
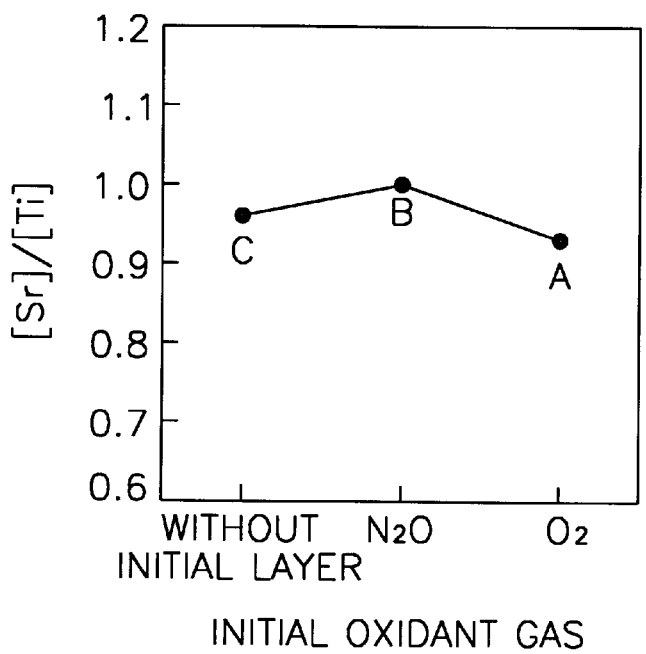

FIGS. 2A and 2B are graphs illustrating the composition ratio of Sr and Ti ([Sr]/[Ti]) when different oxidant gas components are used to form STO ferroelectric films. In FIG. 2A, the ferroelectric films are deposited in a single step. In FIG. 2B, two deposition steps are used to form initial and main portions of the ferroelectric film. The composition ratios [Sr]/[Ti] of the STO ferroelectric films have been measured by Rutherford Back scattering spectroscopy (RBS).

When ferroelectric films are formed using a single deposition step with an oxidant gas such as $N_2O$, a mixture of $N_2O$ and $O_2$, or $O_2$, the values of [Sr]/[Ti] are 1.10, 0.96, and 0.92, respectively. It can thus be seen that the quantity of Sr increases as the quantity of $N_2O$ increases and that the quantity of Ti increases as the quantity of $O_2$ increases.

The correlation between composition ratios and oxidant gases used is similar when the ferroelectric film is deposited using dual deposition steps. In FIG. 2B, the point A indicates a ferroelectric film formed using the conditions discussed above with regard to the ferroelectric film of FIG. 1B. The point B indicates a ferroelectric film formed using the conditions discussed above with regard to the ferroelectric film of FIG. 1A. The ratio [Sr]/[Ti] at the points A and B are 0.93 and 1.00 respectively. The point C indicates a ferroelectric film formed using a single deposition step as discussed above with regard to the ferroelectric film of FIG. 1C.

Accordingly, it may be effective to use $O_2$ as the initial oxidant gas when forming a ferroelectric film using dual deposition steps to increase the quantity of Sr relative to that of Ti, as shown in FIG. 2B. The use of $O_2$ as the oxidant gas during the initial deposition step may reduce the leakage current of a capacitor using such a ferroelectric film.

The electrical characteristics of ferroelectric films formed using different deposition methods are listed below in Table 2.

during an initial deposition step lasting 60 seconds, and by using a mixture of $N_2O$ and $O_2$ in a proportion of 1:1 in a second deposition step. When using dual deposition steps to form ferroelectric films according to the present invention, the dielectric constant was largest when the ratio [Sr]/[Ti] was 0.93, and the lowest dielectric constant resulted when the ratio [Sr]/[Ti] was 1. This result contradicts the results obtained in the previously cited reference by P. Y. Lesaicherre wherein the largest dielectric constant was obtained when the ratio [Sr]/[Ti] equal 1.

As shown in Table 2, the dielectric constant of a ferroelectric film is dependent on the conditions used in the formation of the film. This difference is believed to be a result of differences in the crystal form of the ferroelectric film deposited and not a result of different gas compositions. The crystal construction of ferroelectric films formed using different oxidant gases is discussed below.

Figure 3A:
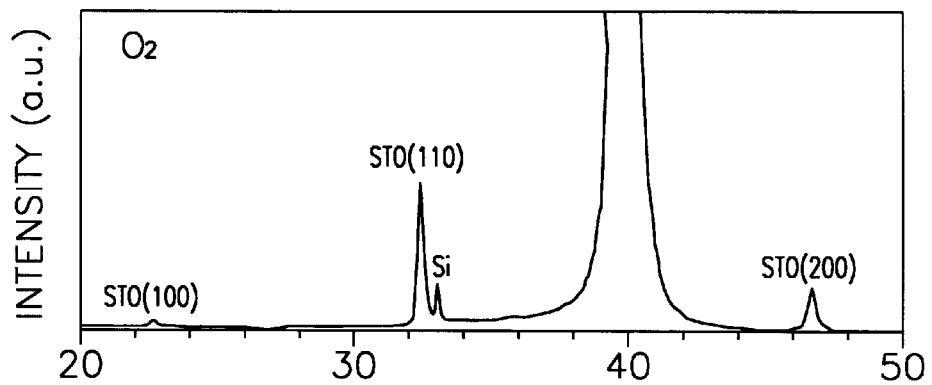
FIGS. 3A to 3C are graphs illustrating X-ray diffraction (XRD) patterns for ferroelectric films formed using a single deposition step.
Figure 3B:
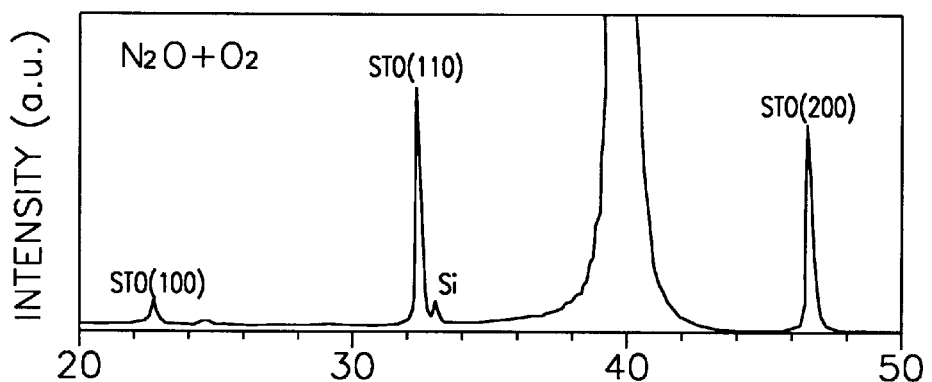
Figure 3C:
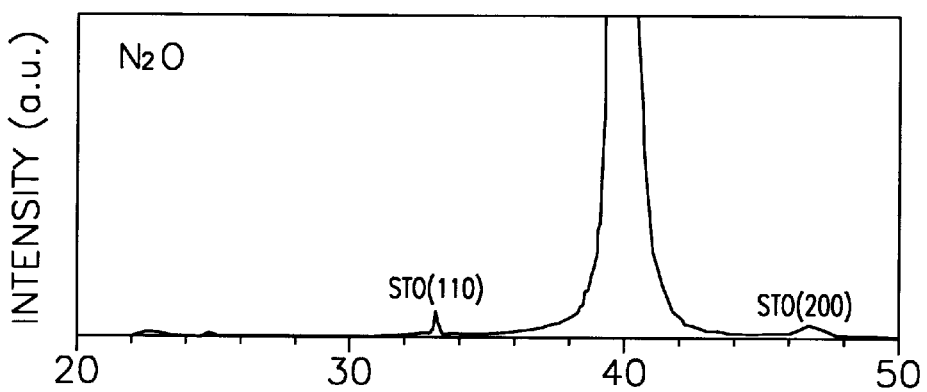

FIGS. 3A–3C illustrate x-ray diffusion (XRD) patterns of ferroelectric films formed using different oxidant gases during an initial deposition step of a two deposition step method. In particular, the initial deposition is used to form 500 Å thick layer of STO. In FIG. 3A, $O_2$ is used as the oxidant gas during the initial deposition step. In FIG. 3B, a mixture of $N_2O$ and $O_2$ in a proportion of 1:1 is used as the oxidant gas during the initial deposition step. In FIG. 3C, $N_2O$ is used as the oxidant gas in the initial deposition step. As the quantity of $N_2O$ in the oxidant gas during the initial deposition step increases, the peak intensity of the XRD is reduced. In addition, the relative ratio of the peak intensity ($I_{110}/I_{200}$) on a cubic surface (110) with respect to that on a cubic surface (200) decreases.

It is believed that the direction of crystal growth shifts according to the variation of the components of the oxidant gas as a result of the change of the cation ratio, that is the [Sr]/[Ti] value. In other words, the oxidant gas influences

| manufacturing condition | | [Sr]/[Ti] | leakage current (A/cm²) at ± 1.5V | | dielectric constant ($\epsilon$) | equivalent oxide thickness (Tox) (Å) | dielectric loss (tan$\sigma$) |
|---|---|---|---|---|---|---|---|
| initial layer | main layer | | + | − | | | |
| — | $N_2O$ | 1.16 | 22.6$\mu$ | 7.7$\mu$ | 176 | 11.0 | 1% |
| — | $N_2O, O_2$ | 0.96 | 197 n | 101 n | 177 | 14.5 | <1% |
| $N_2O$(60 sec) | $N_2O, O_2$ | 1.00 | 3.62 n | 6.13 n | 208 | 12.4 | <0.1% |
| $N_2O$(15 sec) | $N_2O, O_2$ | 0.96 | 2.62 n | 3.37 n | 215 | 11.9 | <0.1% |
| $O_2$(60 sec) | $N_2O, O_2$ | 0.93 | 5.75 n | 8.81 n | 251 | 10.2 | ≈0.1% |

As shown in Table 2, when dual deposition steps are used to form a ferroelectric film, the leakage current of a capacitor using the ferroelectric film may be relatively small, and the dielectric constant of the ferroelectric film may be relatively large. When $O_2$ is used as the oxidant gas during the initial deposition step, the dielectric constant of the resulting ferroelectric film is increased. When $N_2O$ is used as the oxidant gas during an initial deposition step lasting 15 seconds, the leakage current is reduced. In particular, the smallest leakage current resulted when using $N_2O$ as the oxidant gas during an initial deposition step lasting 15 seconds which made up 1.7 percent of the total deposition time.

The highest dielectric constant for the ferroelectric films of Table 2 was obtained with a ratio [Sr]/[Ti] of 0.93. This ferroelectric film was obtained using $O_2$ as the oxidant gas not only the composition of the STO layer, but the oxidant gas also influences the crystal form of the STO layer and also the preferred orientation thereof.

Figure 4A:
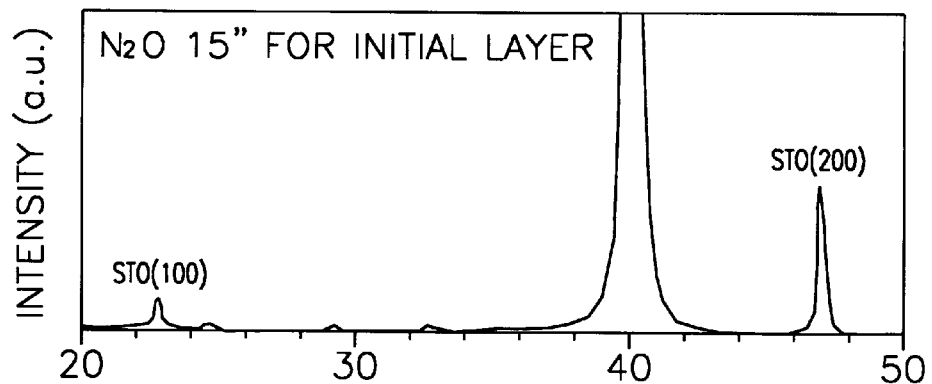
FIGS. 4A to 4C are graphs illustrating X-ray diffraction (XRD) patterns for ferroelectric films formed using dual deposition steps.
Figure 4B:
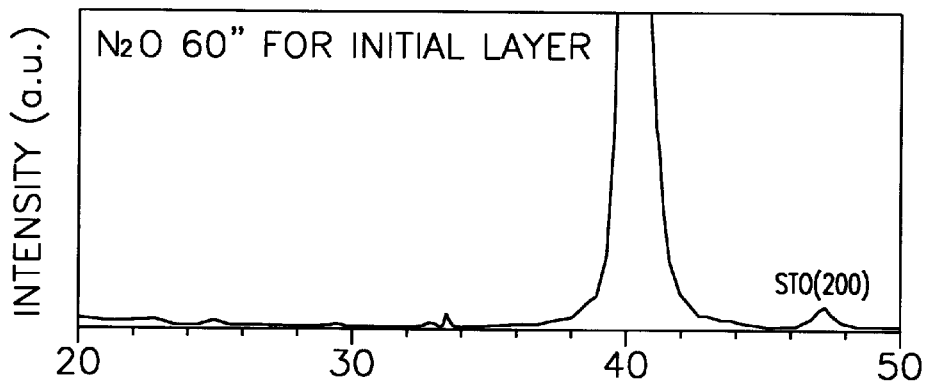
Figure 4C:
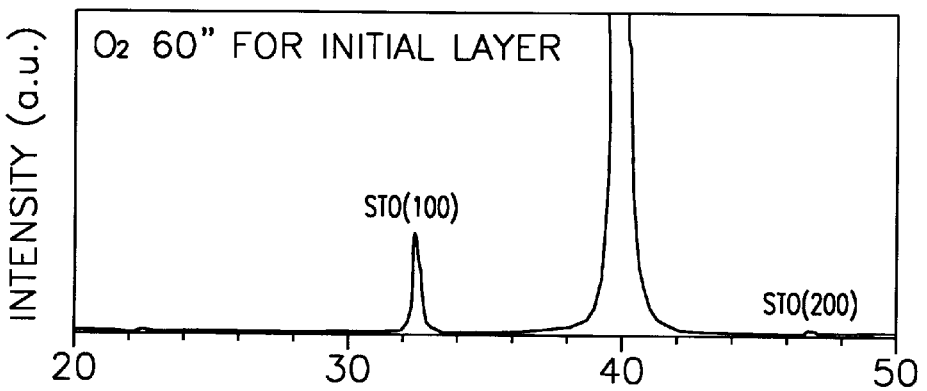

FIGS. 4A–4C illustrate x-ray diffraction (XRD) patterns for ferroelectric films formed using dual deposition steps with different oxidant gases used during the initial deposition step. In FIG. 4A, an STO ferroelectric film is deposited using $N_2O$ as an oxidant gas during the initial deposition step which lasts 15 seconds, and a mixture of $N_2O$ and $O_2$ is used as the oxidant gas in the second deposition step which lasts 14 minutes and 45 seconds. In other words, the initial deposition step lasts for 1.7% of the total deposition time. Peaks of the cubic surface (110) and cubic surface (200) appear, and in particular, the peak of the cubic surface (200) is more intense.

In FIG. 4B, the ferroelectric film is formed using dual deposition steps wherein $N_2O$ is used as the oxidant gas in the initial deposition step which lasts 60 seconds, and a mixture of $N_2O$ and $O_2$ is used as the oxidant gas during the second deposition step which lasts 14 minutes. A peak of the cubic surface (200) is generated intensively, but the peak is lower than that shown in FIG. 4A. In FIG. 4C, a ferroelectric film is formed using dual deposition steps wherein $O_2$ is used as the oxidant gas during the initial deposition step which lasts 60 seconds, and a mixture of $N_2O$ and $O_2$ is used for the oxidant gas during the second deposition step which lasts 14 minutes. The cubic surface (110) occurs apparently.

From the results discussed above, it can be seen that the cubic surface (110) is a preferred orientation when $O_2$ is used as the oxidant gas during the initial deposition step, while the cubic surface (200) is the preferred orientation when $N_2O$ is used as the oxidant gas during the initial deposition step. Furthermore, as the duration of the initial deposition step is reduced and the thickness of the initial layer is reduced, a more intense peak can be obtained on the cubic surface (200). In the examples discussed above, the time of use of the respective oxidant gas is specified, but it is apparent that the methods of the present invention can be applied in cases where the time for the initial deposition step is 1% to 50% of the total deposition time for the ferroelectric film.

In summary, the formation of a ferroelectric film using a two step deposition can reduce protrusions on the ferroelectric film. In addition, the dielectric constant of the ferroelectric film can be increased and the leakage current of a capacitor using the ferroelectric film can be reduced using the two step deposition. The dielectric constant of the ferroelectric film can be increased by using $O_2$ as the oxidant gas during the initial deposition step. Alternately, the leakage current of a capacitor using the ferroelectric film can be reduced by using $N_2O$ as the oxidant gas during the initial deposition step. In particular, the initial deposition step using $N_2O$ as the oxidant gas can have a duration in the range of from 1% to 50% of the total deposition time. Preferably, the initial deposition step has a duration in the range of from 1% to 5% of the total deposition time.

As discussed above, the cubic surface (100) is the preferred orientation when $O_2$ is used as the oxidant gas during the initial deposition step. The cubic surface (200) is the preferred orientation when $N_2O$ is used as the oxidant gas during the initial deposition step. A Perovskite-structured oxide, however, may have different electrical characteristics. In particular, a Perovskite-structured oxide may have a different dielectric constant, a different leakage current, a different stress of the thin film, and a different ion diffusion according to the preferred orientation of the crystal structure. A ferroelectric film having electrical characteristics desired for a specific device can thus be formed by varying the oxidant gas and the deposition time. In particular, a ferroelectric film with a desired crystal structure can be obtained by changing the oxidant gas used in the initial deposition step of a two step deposition method.

Figure 5A:
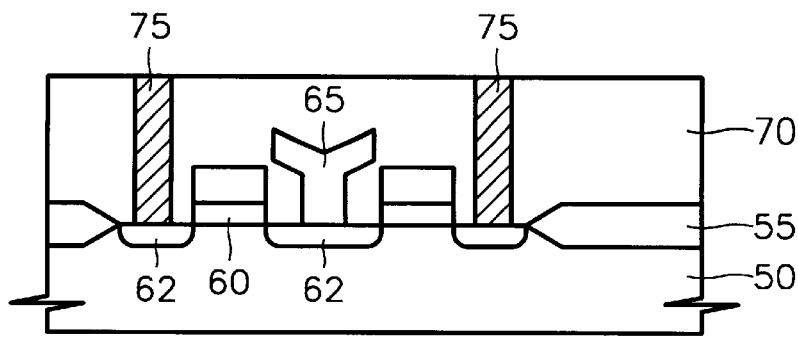
FIGS. 5A to 5D are cross sectional views illustrating steps of a method for forming an integrated circuit capacitor including a ferroelectric film according to the present invention.
Figure 5B:
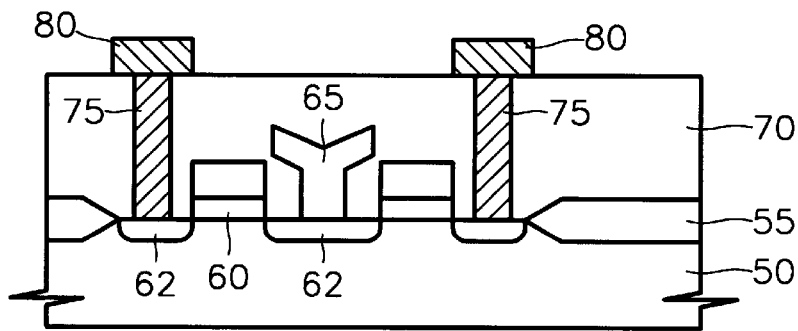

FIGS. 5A–5D are cross-sectional views illustrating steps of a method for manufacturing a capacitor using a ferroelectric film formed by methods according to the present invention. In FIG. 5A, an isolation oxide film 55, a gate 60, and a source/drain region 62 are formed on a semiconductor substrate 50. A bit line 65 is formed in contact with the source/drain region 62, and a buried contact 75 is formed through the insulating layer 70. In FIG. 5B, a conductive layer is formed on the planarized insulating layer 70, and the conductive layer is patterned into a lower electrode 80. The lower electrode 80 can be formed from a material such as Pt, Ir, Ru, $IrO_2$, or $RuO_2$.

Figure 5C:
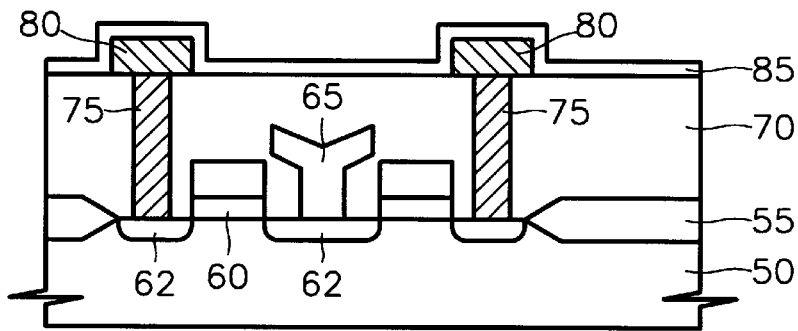

In FIG. 5C, a ferroelectric film 85 is formed by depositing a ferroelectric material on the lower electrode 80 and the insulating layer 70 using a metal organics chemical vapor deposition (MOCVD) technique. The ferroelectric material can be BST, STO, PZT, $Bi_4Ti_3O_{12}$, or $SrBi_2Ta_2O_9$. For the purposes of this discussion, STO will be used as the ferroelectric material.

Generally, the STO layer has a thickness in the range of 100 Å to 500 Å, and the total time required to deposit the ferroelectric film 85 is in the range of 15 to 20 minutes. Two deposition steps are used to deposit the ferroelectric film 85, and sources are supplied to an argon carrier gas chamber with the proportion of Sr:Ti being maintained at 77:23. A 0.15 mol % solution of $Sr(DPM)_2$tetraglyme dissolved in tetrahydrofuran (THF) is used as the source of Sr. A 0.40 mol % solution of $Ti(DPM)_2(O-i-Pr)_2$ dissolved in THF is used as the source of Ti. The deposition temperatures and pressures are shown in Table 1.

During the initial deposition step, oxygen is used as the oxidant gas for a period of time in the range of 1% to 50% of the total deposition time. For example, the initial deposition step can have a duration which is 6.7% of the total deposition time wherein oxygen is used as the oxidant gas. A mixture of oxygen gas and nitrogen gas is used as the oxidant gas during the second deposition step which last for the remainder of the total deposition time. For example, if the first deposition step lasts for 6.7% of the total deposition time, the second deposition step will last for 93.3% of the total deposition time. The ferroelectric film thus formed may have an increased dielectric constant and a reduction in the protrusions thereon. In addition, the capacitor using this ferroelectric film may have a relatively small leakage current.

Figure 5D:
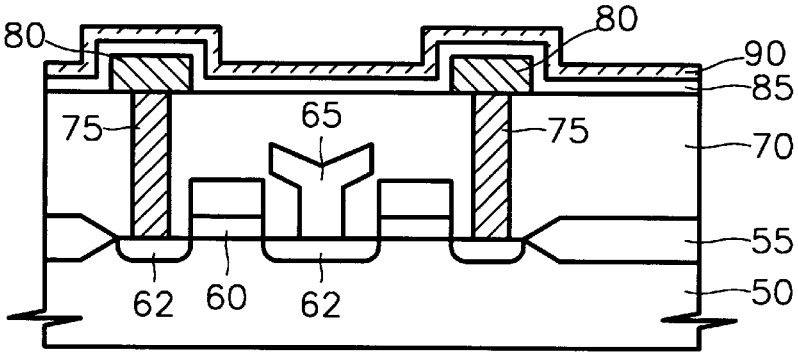

In FIG. 5D, an upper electrode 90 is formed on the ferroelectric film 85 opposite the lower electrode 80. The upper electrode can be annealed for 20 to 60 minutes in an $N_2$ ambient at a temperature in the range of 500° C. to 700° C. so that the interface between the upper electrode 90 and the ferroelectric film 85 can be stabilized. The upper electrode 90 can be formed from a material such as Pt, Ir, Ru, $IrO_2$, or $RuO_2$. The upper electrode layer 90 can then be patterned to complete the capacitor, and insulating layers, metallization lines, and passivation layers can be formed to complete the semiconductor device.

While the ferroelectric film 85 was formed using a MOCVD technique, alternate deposition techniques can be used to form the ferroelectric film. For example, a sputtering technique can be used to form the ferroelectric film. When using a sputtering technique, $N_2O$ and Ar gases can be used as a sputtering gas during the first deposition step, and $N_2O$, Ar, and $O_2$ gases can be used during the second deposition step. In addition to the gases discussed above, a nitrided gas $NO_x$ or $O_3$ can be used.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming a ferroelectric film on an integrated circuit substrate, said method comprising:

forming a first portion of the ferroelectric film on the integrated circuit substrate using a source gas and a first oxidant comprising $O_2$ gas or $O_3$ gas for a first period of time; and forming a second portion of the ferroelectric film on said first portion of the ferroelectric film opposite the substrate using said source gas and a second oxidant for a second period of time wherein said second oxidant comprises N$_2$O gas;

wherein said second oxidant comprising N$_2$O gas is not used during said step of forming said first portion of the ferroelectric film.

2. A method according to claim 1 wherein forming said second portion of said ferroelectric film comprises using a mixture of said first oxidant and said second oxidant.

3. A method according to claim 1 wherein said first period of time and said second period of time define a total deposition time and wherein said first period of time is in the range of 1% to 50% of said total deposition time.

4. A method according to claim 1 wherein the ferroelectric film is chosen from the group consisting of SrTiO$_3$, (Ba, Sr)TiO$_3$, PbZrTiO$_3$, SrBi$_2$Ta$_2$O$_9$, (Pb, La) (Zr, Ti)O$_3$, and Bi$_4$Ti$_3$O$_{12}$.

5. A method according to claim 1 wherein said source gas comprises Sr(DPM)$_2$ tetraglyme and Ti(DPM)$_2$(O-i-Pr)$_2$.

6. A method according to claim 1 wherein said step of forming said first portion of the ferroelectric film is preceded by the step of forming a first conductive film on the integrated circuit substrate, and wherein the step of forming said second portion of the ferroelectric film is followed by the step of forming a second conductive film on said second portion of the ferroelectric film opposite said first conductive film.

7. A method for forming a ferroelectric film on an integrated circuit substrate, said method comprising:

forming a first portion of the ferroelectric film on the integrated circuit substrate using a source gas and a first oxidant comprising N$_2$O; and forming a second portion of the ferroelectric film on said first portion of the ferroelectric film opposite the substrate using said source gas and a second oxidant comprising O$_2$ gas or O$_3$ gas;

wherein said second oxidant comprising O$_2$ gas or O$_3$ gas is not used during said step of forming said first portion of the ferroelectric film.

8. A method according to claim 7 wherein forming said second portion of said ferroelectric film comprises using a mixture of said first oxidant and said second oxidant.

9. A method according to claim 7 wherein said step of forming first portion of the ferroelectric film is performed for a first period of time and said step of forming said second portion of the ferroelectic film is performed for a second period of time, wherein said first period of time and said second period of time define a total deposition time and wherein said first period of time is in the range of 1% to 50% of said total deposition time.

10. A method according to claim 7 wherein the ferroelectric film is chosen from the group consisting of SrTiO$_3$, (Ba, Sr)TiO$_3$, PbZrTiO$_3$, SrBi$_2$Ta$_2$O$_9$, (Pb, La) (Za, Ti)O$_3$, and Bi4Ti$_3$O$_{12}$.

11. A method according to claim 7 wherein said source gas comprises Sr(DPM)$_2$ tetraglyme and Ti(DPM)$_2$(O—I—Pr)$_2$.

12. A method for forming a ferroelectric film on an integrated circuit substrate, said method comprising:

forming a first portion of the ferroelectric film on the integrated circuit substrate using a source gas and a first oxidant comprising N$_2$O for a first period of time; and forming a second portion of the ferroelectric film on said first portion of the ferroelectric film opposite the substrate using said source gas and a second oxidant comprising O$_2$ gas or O$_3$ gas for a second period of time;

wherein said second oxidant is not used during said step of forming said first portion of the ferroelectric film.

13. A method according to claim 12 wherein forming said second portion of said ferroelectric film comprises using a mixture of said first oxidant and said second oxidant.

14. A method according to claim 12 wherein said first period of time and said second period of time define a total deposition time and wherein said first period of time is in the range of 1% to 50% of said total deposition time.

15. A method according to claim 12 wherein the ferroelectric film is chosen from the group consisting of SrTiO$_3$, (Ba, Sr)TiO$_3$, PbZrTiO$_3$, SrBi$_2$Ta$_2$O$_9$, (Pb, La) (Za, Ti)O$_3$, and Bi4Ti$_3$O$_{12}$.

16. A method according to claim 12 wherein said source gas comprises Sr(DPM)$_2$ tetraglyme and Ti(DPM)$_2$(O—I—Pr)$_2$.

17. A method for forming a ferroelectric film on an integrated circuit substrate, said method comprising:

forming a first portion of the ferroelectric film on the integrated circuit substrate using a source gas and a first oxidant for a first period of time; and forming a second portion of the ferroelectric film on said first portion of the ferroelectric film opposite the substrate using said source gas and a second oxidant for a second period of time;

wherein said second oxidant is not used during said step of forming said first portion of the ferroelectric film;

wherein said second oxidant comprises N$_2$O and wherein said first oxidant comprises O$_2$ gas or O$_3$ gas.

* * * * *

UNITED STATES PATENT AND TRADEMARK OFFICE
CERTIFICATE OF CORRECTION

PATENT NO. : 6,127,218
DATED : October 3, 2000
INVENTOR(S) : Chang-seok Kang

It is certified that error appears in the above-identified patent and that said Letters Patent is hereby corrected as shown below:

Title page, item [56] and column 1, in the References Cited, please add:

6-21337 (Abstract) 1/28/94 Japan

P-Y. Lesaicherre, *Preparation of ER MOCVD SrTiO₃ Thin Films and Their Application to a Gbit-Scale DRAM Stacked Capaitor Structure*, Korean Vacuum Society, Seoul, February 17, 1995.

P.Y. Lesaicherre et al., *Preparation of Sr TiO₃ Thin Films by ECR and Thermal MOCVD*, Mat. Res. Soc. Symp. Proc., Vol. 310, 1993 Materials Research Society, pp. 487-495.

Takaaki Kawahara et al., *Surface Morphologies and Eletrical Properties of (Ba, Sr) TiO₃ Films Prepared by Two-Step Deposition of Liquid Source Chemical Vapor Deposition*, Jpn. J. Appl. Phys., Vol. 34, Part 1, No. 9B, September 1995, pp. 5077-5082.

Title Page, Attorney, Agent, or Firm, please correct "Sigley" to read --Sibley--.

Signed and Sealed this

Third Day of July, 2001

*Attest:*

*Attesting Officer*

NICHOLAS P. GODICI
*Acting Director of the United States Patent and Trademark Office*